(12) United States Patent
Chen

(10) Patent No.: US 10,254,308 B2
(45) Date of Patent: Apr. 9, 2019

(54) ELECTRONIC DEVICE TESTING APPARATUS WITH LOCKING MECHANISM FOR PRESSING HEADER AND SOCKET PLATE

(71) Applicant: Chroma ATE Inc., Taoyuan County (TW)

(72) Inventor: Chien-Ming Chen, Taoyuan County (TW)

(73) Assignee: CHROMA ATE INC., Taoyuan County (TW)

( * ) Notice: Subject to any disclaimer, the term of this patent is extended or adjusted under 35 U.S.C. 154(b) by 134 days.

(21) Appl. No.: 15/480,427

(22) Filed: Apr. 6, 2017

(65) Prior Publication Data

US 2017/0292973 A1    Oct. 12, 2017

(30) Foreign Application Priority Data

Apr. 12, 2016 (TW) .............................. 105111348 A

(51) Int. Cl.
*G01R 1/04* (2006.01)
*H01R 13/629* (2006.01)

(52) U.S. Cl.
CPC ..... *G01R 1/0466* (2013.01); *H01R 13/62955* (2013.01); *H01R 13/62966* (2013.01)

(58) Field of Classification Search
CPC ...... G01R 1/04; G01R 1/0408; G01R 1/0433; G01R 1/0491; G01R 1/06744;
(Continued)

(56) References Cited

U.S. PATENT DOCUMENTS

2004/0232934 A1    11/2004    Sinclair
2005/0164530 A1*   7/2005    Yates ................... G01R 1/0466
                                                         439/73
(Continued)

FOREIGN PATENT DOCUMENTS

CN    203376446 U    1/2014
TW    M460276 U1    8/2013
TW    201610651 A    3/2016

OTHER PUBLICATIONS

Office Action dated Nov. 15, 2016 in corresponding Taiwan application (No. 105111348).

*Primary Examiner* — Tung X Nguyen
(74) *Attorney, Agent, or Firm* — McClure, Qualey & Rodack, LLP

(57) ABSTRACT

An electronic device testing apparatus with a locking mechanism for locking a press head and a socket plate is provided. When an electronic device is to be tested, a lifting arm is lowered so that a contact portion is in contact with the electronic device, and a locking mechanism is actuated to detain the press head on the socket plate. A pressing force generating device exerts a pressing force onto the electronic device and the socket plate, and at least a portion of a reaction force can be directed back to the locking mechanism. The locking mechanism is adapted to detain the press head on the socket plate. When the pressing force generating device generates a predetermined pressing force to certainly establish electrical connection between the electronic device and the chip socket, the reaction force produced by the chip socket may be distributed over the locking mechanism.

14 Claims, 10 Drawing Sheets

(58) Field of Classification Search
CPC ............... G01R 1/073; G01R 1/07342; G01R 31/2601; G01R 31/2886; G01R 31/2887
See application file for complete search history.

(56) References Cited

U.S. PATENT DOCUMENTS

| | | |
|---|---|---|
| 2007/0170938 A1 | 7/2007 | Chen |
| 2009/0275220 A1* | 11/2009 | Hwang ................ G01R 1/0466 439/73 |
| 2011/0201221 A1* | 8/2011 | Kobayashi ........... G01R 1/0466 439/331 |

* cited by examiner

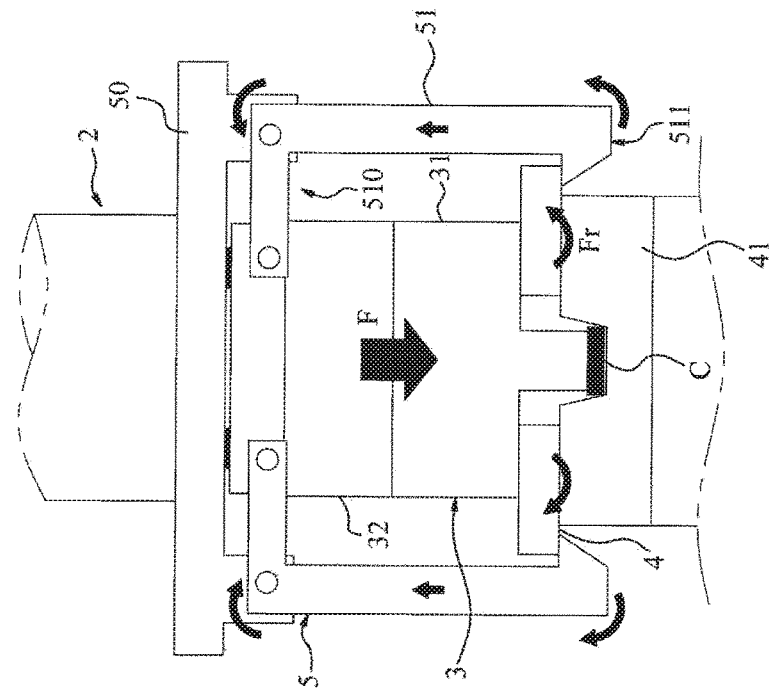
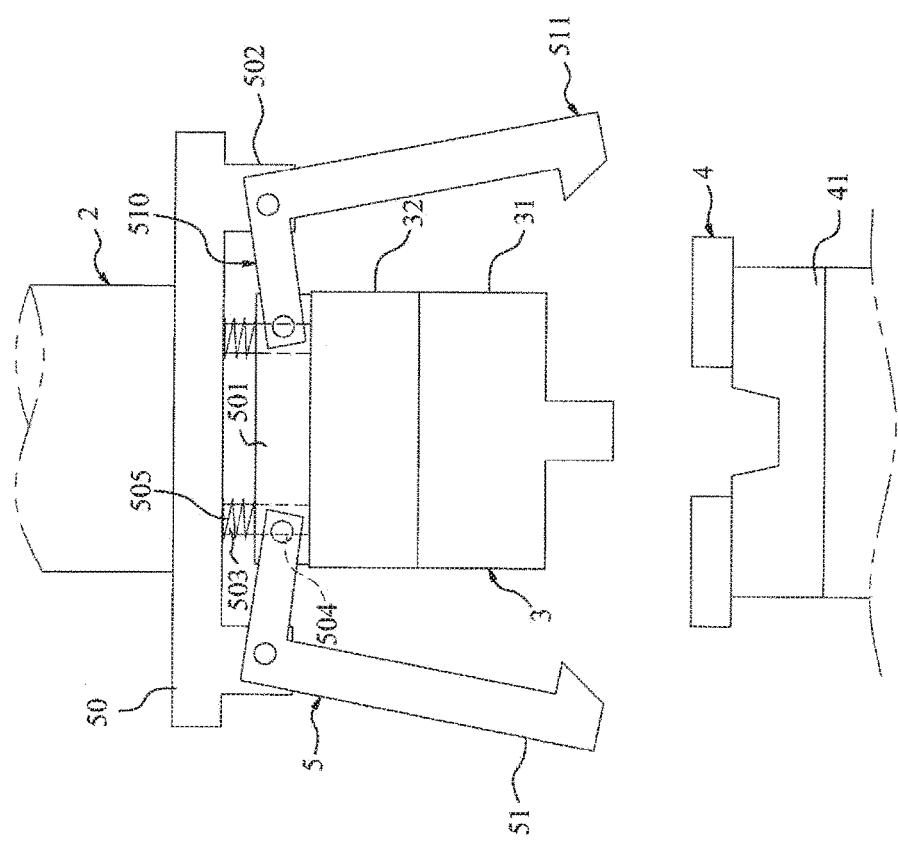

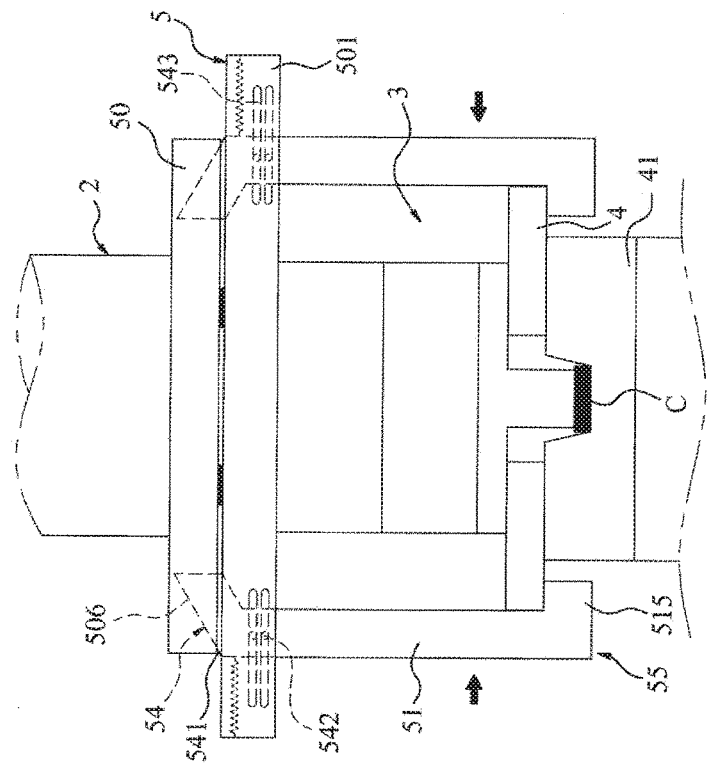
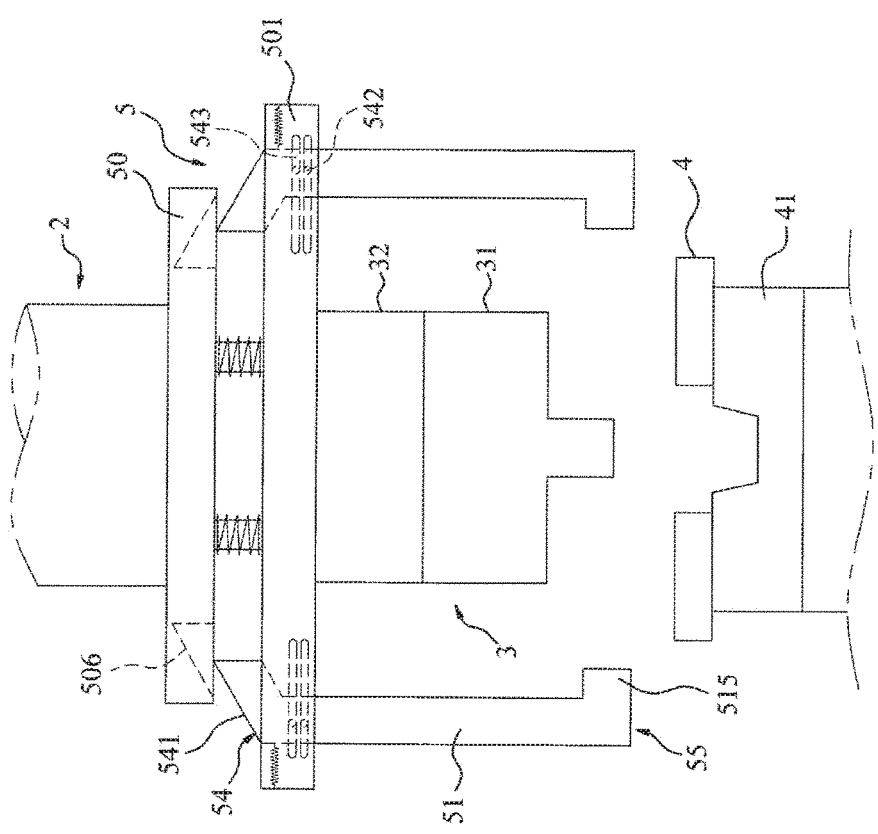

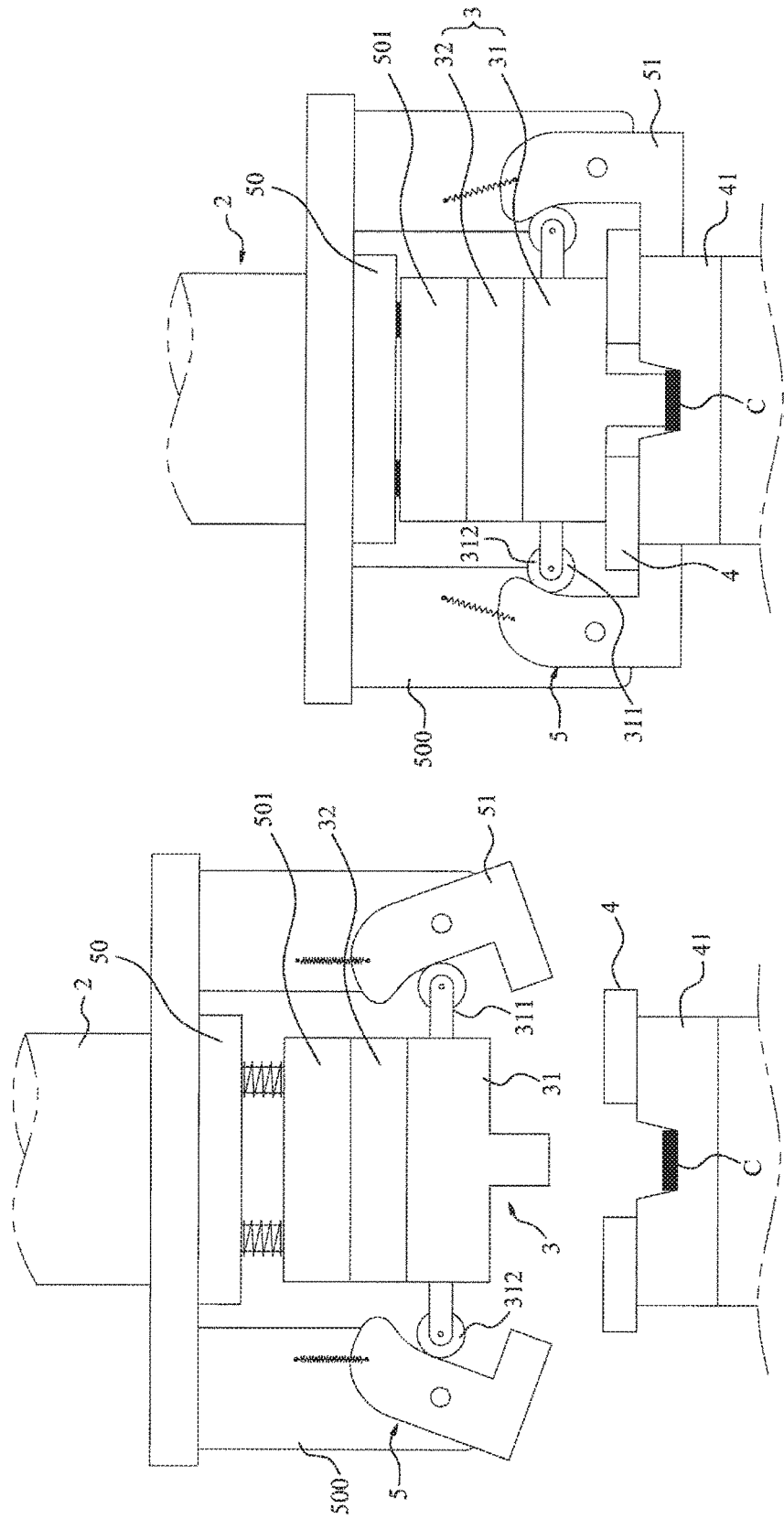

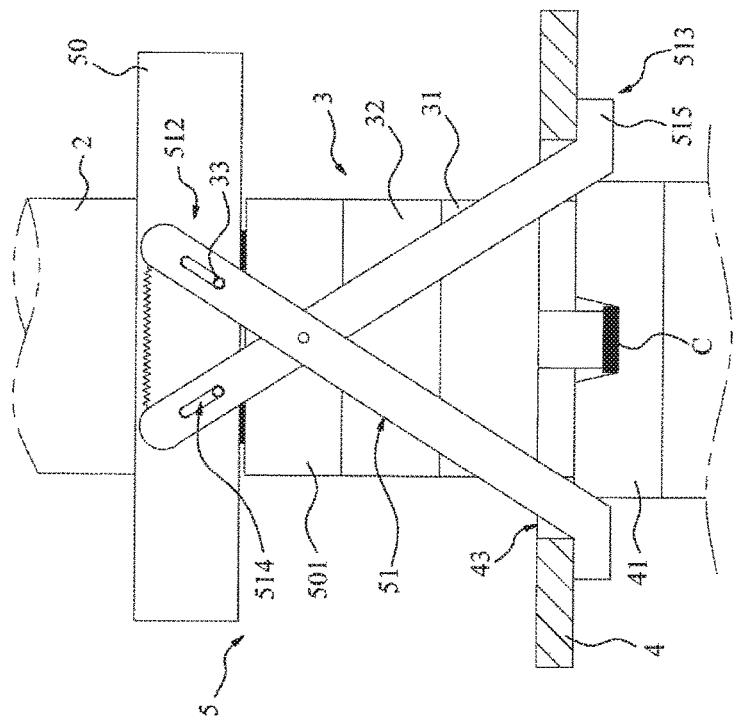
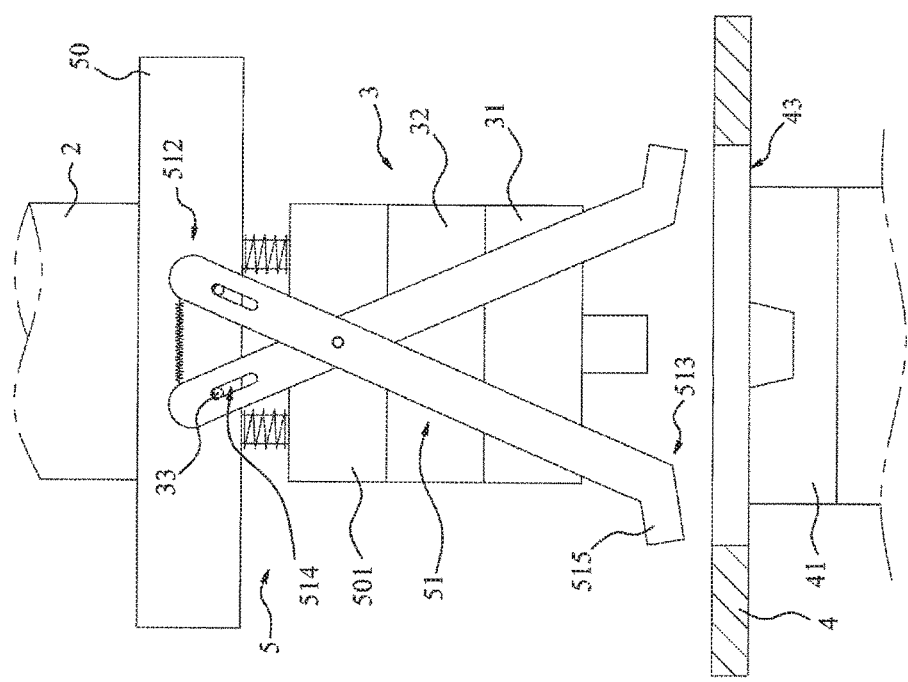

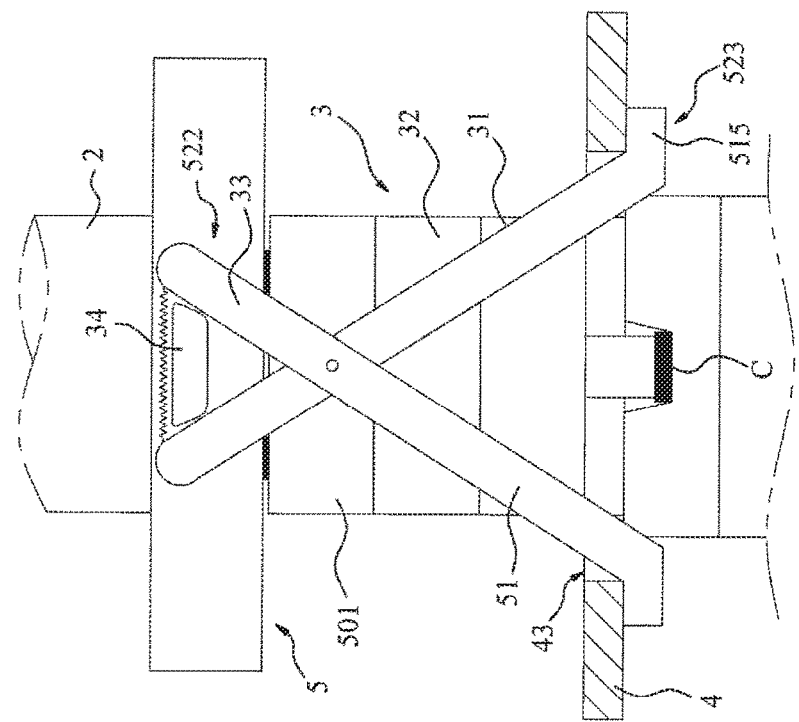
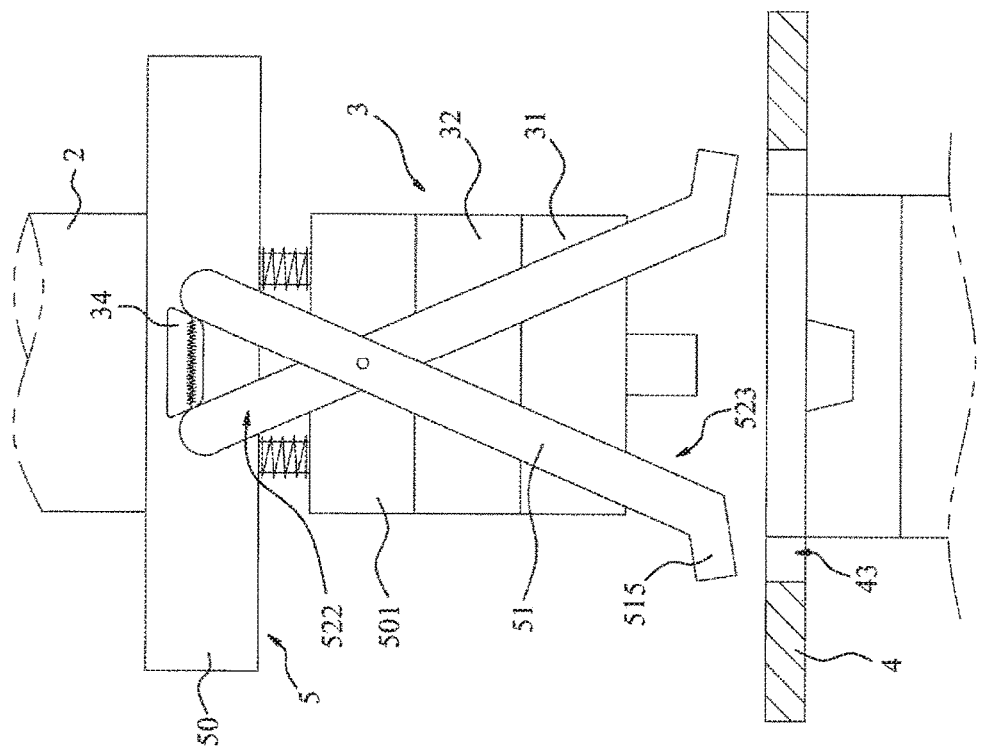
FIG. 6A
FIG. 6B

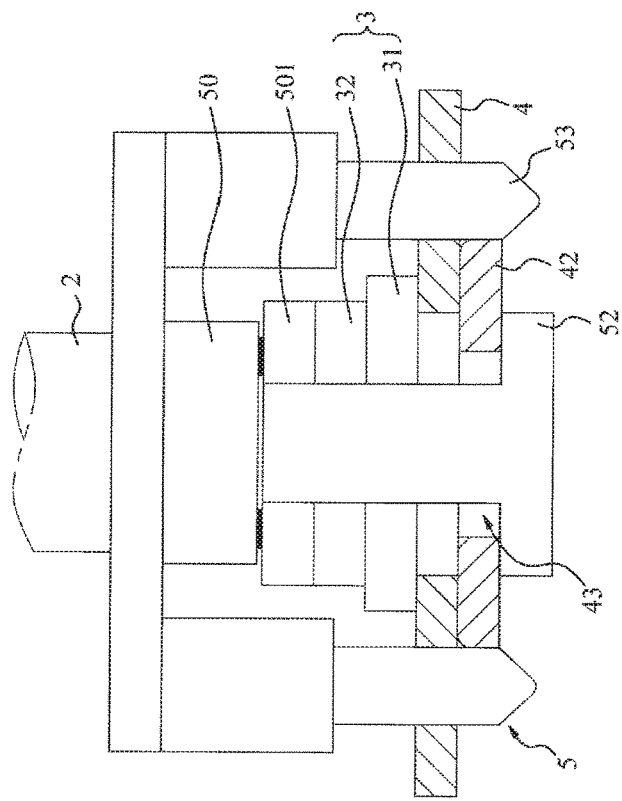
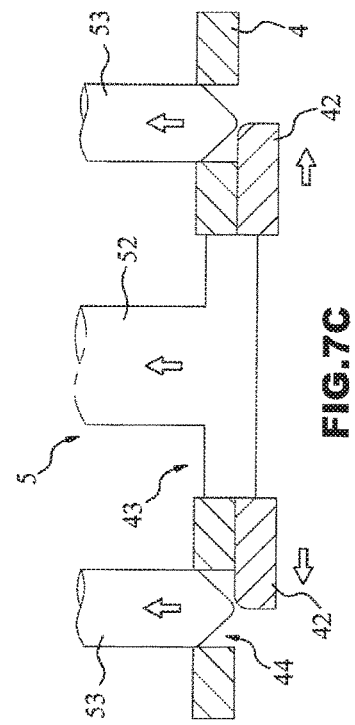
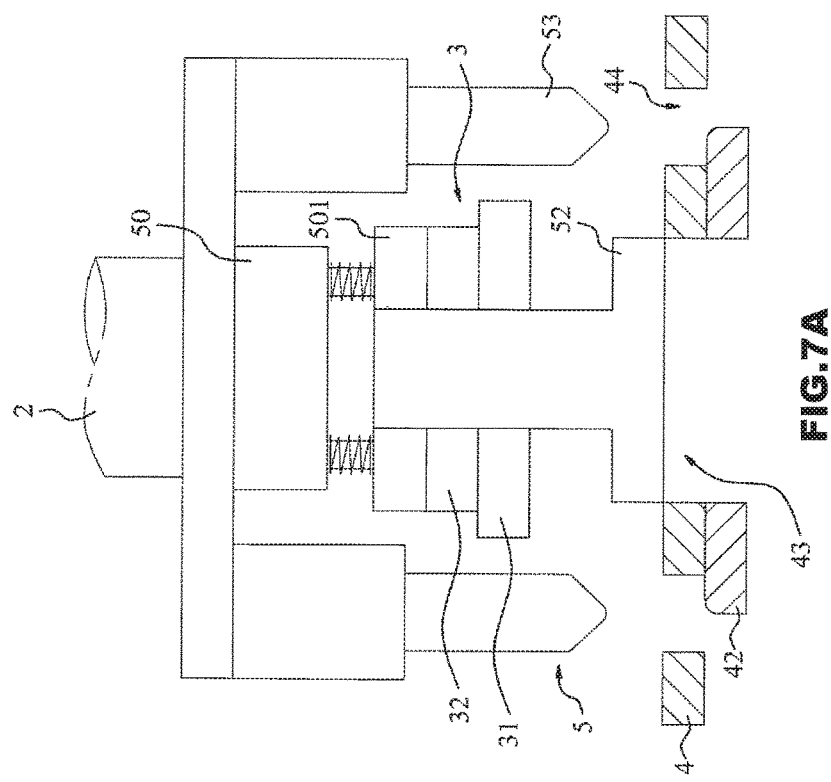
FIG.7A
FIG.7B
FIG.7C

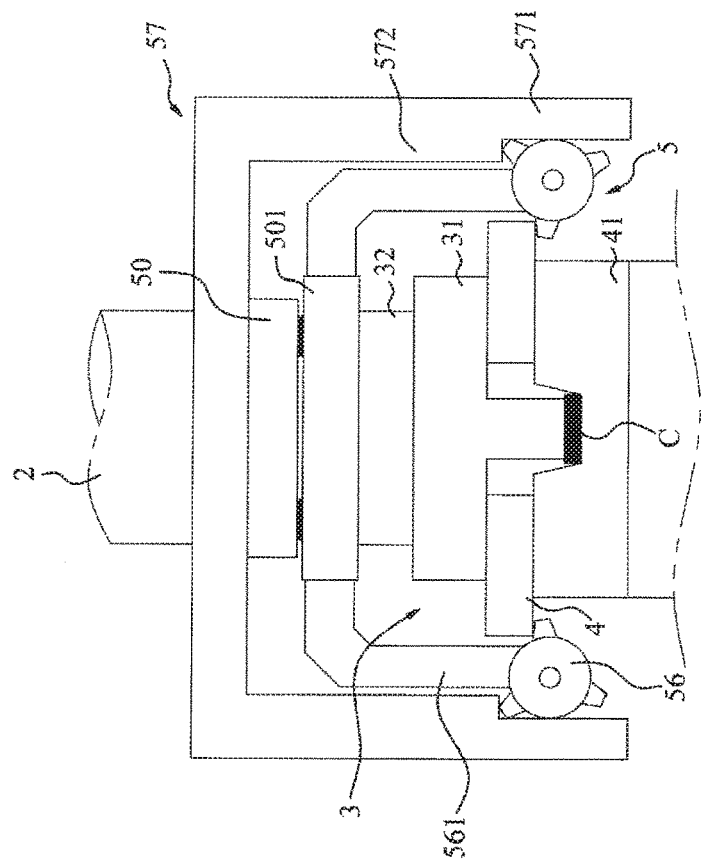
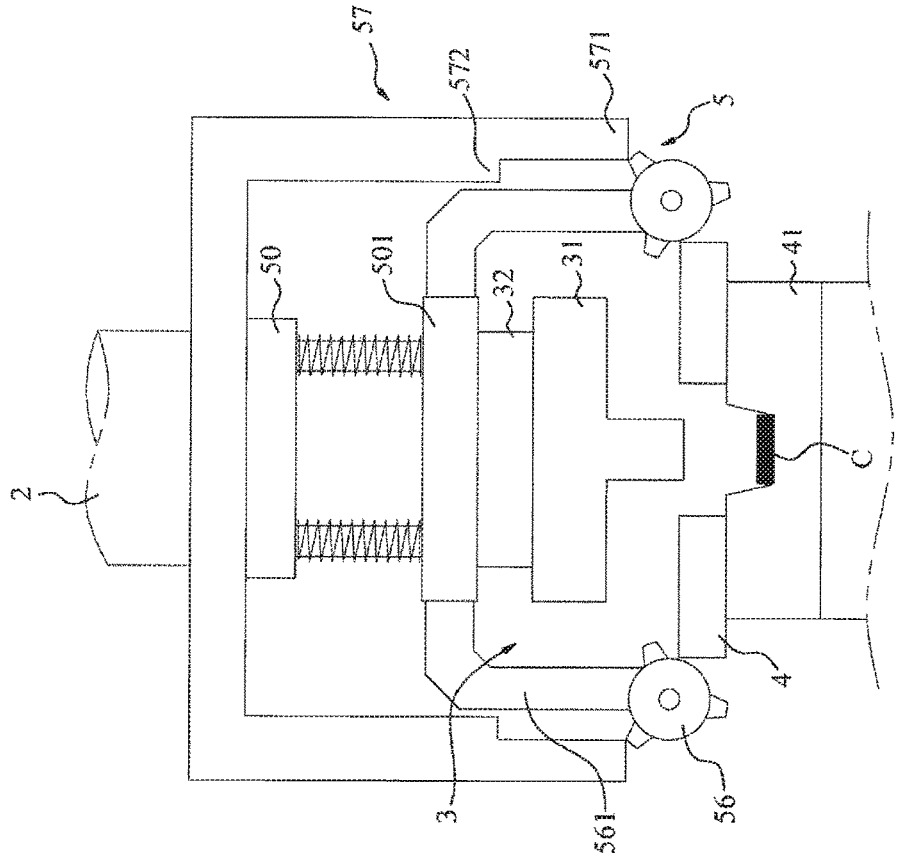

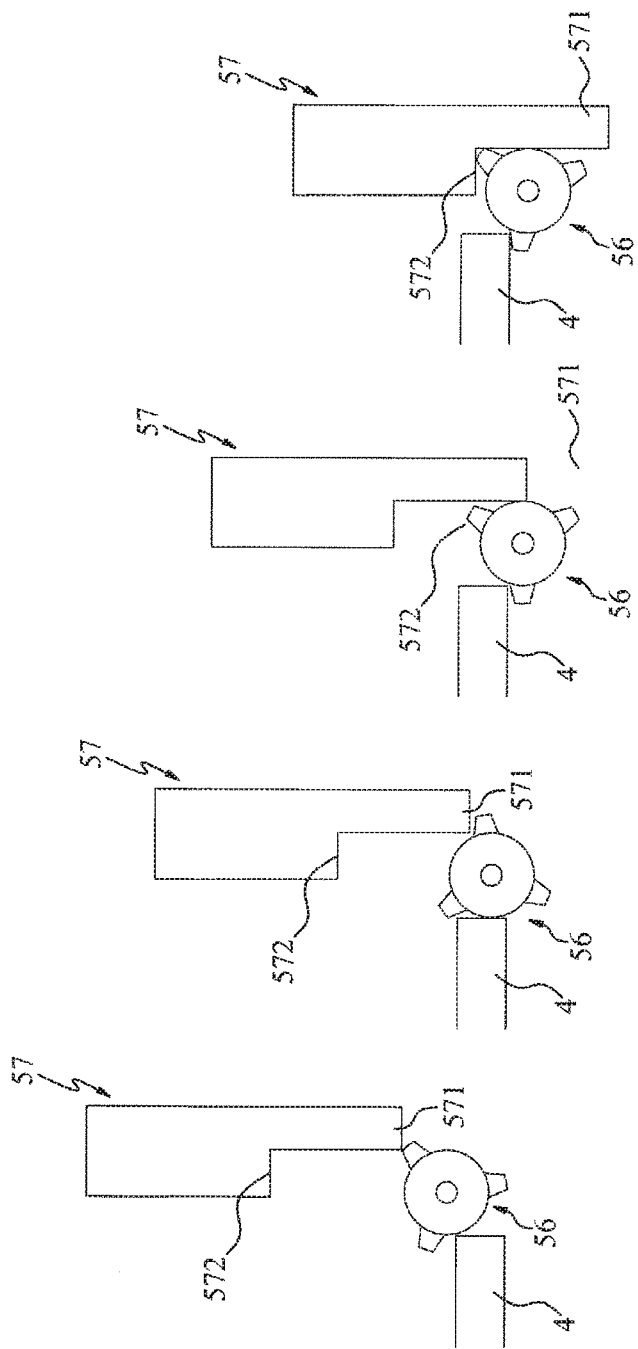

ELECTRONIC DEVICE TESTING APPARATUS WITH LOCKING MECHANISM FOR PRESSING HEADER AND SOCKET PLATE

BACKGROUND OF THE INVENTION

Field of the Invention

The invention relates to an electronic device testing apparatus with a locking mechanism for locking a press head and a socket plate, particularly to an electronic device testing apparatus capable of exerting a predetermined pressing force and of testing the electronic device.

Description of the Related Art

With continuous advancement of semiconductor technology, functions and capabilities of a single chip are greatly increased. As a result, contacts or pins of a chip are also greatly increased.

FIG. 1 is a schematic view showing acting force and reaction force of a conventional electronic device testing apparatus. As for current technical level, some of chips have a dimension of 70 mm×70 mm and 4500 or more contacts thereon. In the case of FIG. 1, the electronic device C has 4500 contacts on its lower surface while the chip socket 41 also has 4500 pogo pins for testing the electronic device C. Each pogo pin has a spring force of about 25 gf to 35 gf, so that 4500 pogo pins have a total spring force of about 115 Kgf.

In other words, after the electronic device C to be tested is placed in the chip socket 41, a contact head of electronic device testing apparatus has to exert a pressing force greater than 115 Kgf in order to ensure electrical contact between the contacts and the pogo pins. Furthermore, some of users may require that the electronic device testing apparatus is capable of exerting a pressing force of 200 Kgf.

As for the conventional electronic device testing apparatus as shown in FIG. 1, when a lifting arm 2 exerts a first pressing force F1 so that the contact portion 31 is abutted on the electronic device C to be tested, and then the pressing force generating device 32 further generates a second pressing force F2 to overcome a spring force F3 of the pogo pins in order to ensure electric contact between the contacts of the electronic device C and the pogo pins.

Under the effect of the great action force and the great reaction force, the strength of the support structure of the testing apparatus is challenged severely. Thus, there is severe impact on the service life of the testing apparatus as long as the strength is insufficient.

SUMMARY OF THE INVENTION

A main object of the invention is to provide an electronic device testing apparatus capable of ensuring electrical contact between the testing apparatus and contacts of an electronic device, distributing reaction force, preventing stress concentration and improving stability and service life of the testing apparatus.

To achieve the above object, an electronic device testing apparatus according to the invention includes essentially: a lifting arm, a press head, a socket plate and a locking mechanism. The press head is disposed on the lifting arm, and the press head includes a pressing force generating device and a contact portion arranged on the pressing force generating device. The socket plate is disposed beneath the press head and provided with a chip socket facing the contact portion. The locking mechanism is disposed on at least one of the press head and the socket plate. When an electronic device placed in the chip socket is to be tested, the lifting arm is lowered to allow the contact portion to contact the electronic device, and the locking mechanism is actuated to detain the press head on the socket plate while the pressing force generating device exerts a pressing force onto the contact portion, the electronic device, the chip socket and the socket plate, and at least a portion of a reaction force is exerted on or directed back to the locking mechanism.

The locking mechanism is adapted to securely detain the press head on the socket plate. When the pressing force generating device exerted a predetermined pressing force to ensure electrical contact between the electronic device and the chip socket, the reaction force produced by the chip socket may be distributed over the locking mechanism so as to reduce stress concentration, and hence improve stability and service life of the testing apparatus.

According to another aspect of the invention, the electronic device testing apparatus includes essentially: a first power source, a lifting arm, a press head, a socket plate, a second power source and a locking mechanism. The lifting arm is connected to the first power source, the press head is disposed on the lifting arm, and the socket plate is disposed beneath the press head and provided with a chip socket thereon. The locking mechanism is disposed in at least one of the press head and the socket plate and is connected to the second power source. When an electronic device placed in the chip socket is to be tested, the electronic device is, the lifting arm is actuated by the first power source and allow the press head to urge against the electronic device, the locking mechanism is actuated by the second power source to detain the press head on the socket plate.

BRIEF DESCRIPTION OF THE DRAWINGS

FIG. 2A is a schematic view of a first embodiment according to the invention showing that a press head is separated from a socket plate.

FIG. 2B is a schematic view of the first embodiment according to the invention showing that the press head is engaged with the socket plate.

FIG. 3A is a schematic view of a second embodiment according to the invention showing that a press head is separated from a socket plate.

FIG. 3B is a schematic view of the second embodiment according to the invention showing that the press head is engaged with the socket plate.

FIG. 4A is a schematic view of a third embodiment according to the invention showing that a press head is separated from a socket plate.

FIG. 4B is a schematic view of the third embodiment according to the invention showing that the press head is engaged with the socket plate.

FIG. 5A is a schematic view of a fourth embodiment according to the invention showing that a press head is separated from a socket plate.

FIG. 5B is a schematic view of the fourth embodiment according to the invention showing that the press head is engaged with the socket plate.

FIG. 6A is a schematic view of a fifth embodiment according to the invention showing that a press head is separated from a socket plate.

FIG. 6B is a schematic view of the fifth embodiment according to the invention showing that the press head is engaged with the socket plate.

FIG. 7A is a schematic view of a sixth embodiment according to the invention showing that a press head is engaged from a socket plate in.

FIG. 7B is a schematic view of the sixth embodiment according to the invention showing that the press head is engaged with the socket plate.

FIG. 7C is a schematic view of the sixth embodiment according to the invention showing that the press head is being separated from the socket plate.

FIG. 8A is a schematic view of a seventh embodiment according to the invention showing that a press head is separated from a socket plate.

FIG. 8B is a schematic view of the seventh embodiment according to the invention showing that the press head is engaged with the socket plate.

FIGS. 9A to 9D are schematic views of the seventh embodiment according to the invention showing that a ratchet hinged to a ratchet holder is engaged with the socket plate.

FIG. 10C is a schematic view of the eighth embodiment according to the invention showing that the horizontal slider is protruded out of the pawl in.

DESCRIPTION OF THE PREFERRED EMBODIMENTS

Figure 1:
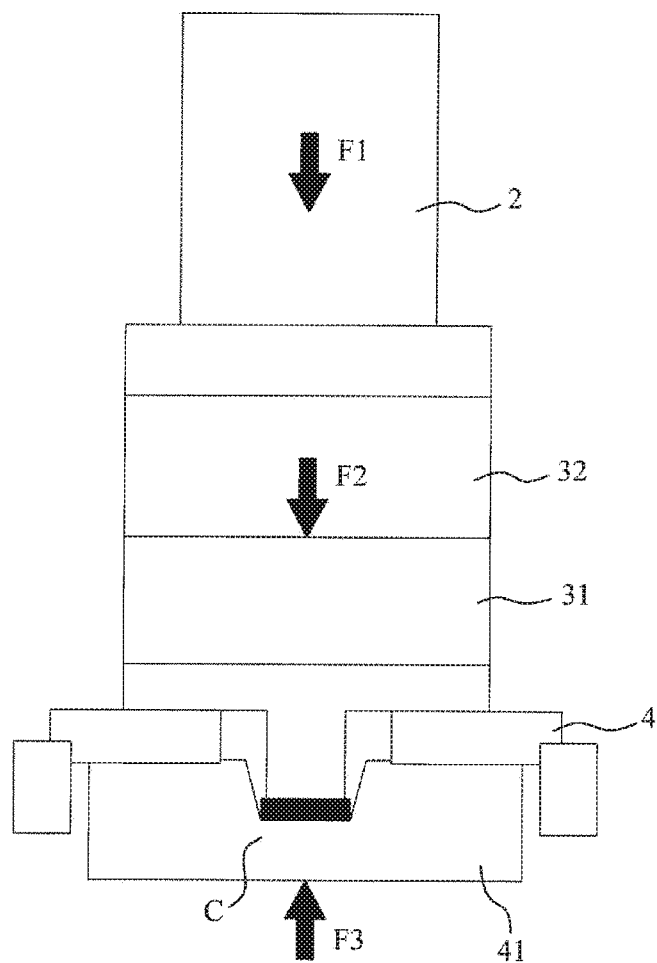
FIG. 1 is a schematic view showing acting force and reaction force exerted on a conventional electronic device testing apparatus.

Description will be made of an electronic device testing apparatus of embodiments of the invention with reference to the figures wherein similar elements are denoted by the same reference numeral. Furthermore, the drawings of the invention are provided only for the illustrative purpose and are not in scale, and not all details are shown in these drawings.

Reference is made to FIGS. 2A and 2B in which FIG. 2A is a schematic view of a first embodiment according to the invention showing that a press head 3 is separated from a socket plate 4, and FIG. 2B is a schematic view of the first embodiment according to the invention showing that the press head 3 is engaged with the socket plate 4. As shown in the figures, the testing apparatus of the first embodiment according to the invention includes a lifting arm 2, a press head 3, a socket plate 4 and a locking mechanism 5. The press head 3 is disposed beneath the lifting arm 2. The press head 3 includes a pressing force generating device 32 and a contact portion 31 arranged beneath the pressing force generating device 32.

The lifting arm 2 of the first embodiment is a robot arm which can ascend and descend and which is capable of exerting a predetermined pressing force. The contact portion 31 is provided for contacting the electronic device C. The contact portion 31 may comprise a suction module for picking, placing and transferring the electronic device C other aspects of the inventions. The pressing force generating device 32 is a pneumatic pressing force generating device which generates a pressing force by means of air inflation. However, the pressing force generating device of the invention is not limited to a pneumatic pressing force generating device and may be replaced with a hydraulic pressing force generating device or other equivalent device which could generate a sufficient pressing force.

As shown in the figures, a socket plate 4 having a chip socket 41 is disposed beneath the press head 3, and the chip socket 41 is in correspondence with the contact portion 31. The chip socket 41 of the first embodiment is a testing socket, which is used to carry the electronic device C. A plurality of probes (not shown) are disposed in the chip socket 41 and serve as an electrical connection interface between the electronic device C and the testing apparatus.

The locking mechanism 5 of the first embodiment is disposed between the lifting arm 2 and the press head 3, wherein the locking mechanism 5 of the first embodiment includes essentially a base 50, a slider 501, two pawls 51 and two springs 505. The base 50 is connected to the lower end of the lifting arm 2 and includes two protrusions 502 and two guide bars 503. The protrusions 502 and the guide bars 503 extend downwardly. The slider 501 is formed with two guide holes 504 corresponding to the two guide bars 503 of the base 50, and the two guide bars 503 of the base 50 are fitted into the guide boles 504 of the slider 501. That is, the slider 501 is coupled to the base 50 and can be slidably lifted or lowered with respect to the base 50.

As shown in FIGS. 2A and 2B, two springs 505 are disposed between the base 50 and the slider 501 and are penetrated by the two guide bars 503 so that the slider 501 is biased toward an initial position by spring force of the two springs 505. The pressing force generating device 32 is disposed between the slider 501 and the contact portion 31. The pawl 51 of the first embodiment includes a fixed portion 510 and a movable portion 511, which are arranged on two ends of the pawl 51, respectively. Two ends of the fixed portion 510 are hinged to the protrusion 502 and the slider 501 of the base 50, respectively.

The operation of this embodiment will be described later. When an electronic device C placed in the chip socket 41 is to be tested, the lifting arm 2 is lowered so that the contact portion 31 is in contact with the electronic device C. Then, the lifting arm 2 is further lowered so that the two guide bars 503 of the base 50 are inserted into the two guide holes 504 of the slider 501 while the movable portion 511 is swung inward due to the fact that the fixed portion 510 of the pawl 51 is linked to the slider 501 and hence detains the socket plate 4. As such, the press head 3 and the socket plate 4 are firmly engaged with each other. Further, the pressing force generating device 32 exerts a pressing force F to the contact portion 31, the electronic device C, the chip socket 41 and the socket plate 4, while as shown in FIG. 2B, a reaction force Fr is directed back to the locking mechanism 5 and the chip socket 41 of the socket plate 4. Finally, the electronic device C is tested.

A two-step pressing manner is used in the first embodiment, wherein in the first step, the lift arm 2 is lowered until the contact portion 31 is in contact with the electronic device C, and in the second step, the base 50 and the slider 501 are moved toward each other so that the movable portion 511 of the pawl 51 is swung to detain the socket plate 4. However, when the movable portion 511 of the pawl 51 detains the socket plate 4, the press head 3 is firmly engaged with the socket plate 4. When the pressing force generating device 32 exerts the pressing force F, electrical contact between the electronic device C and the chip socket 41 can be ensured. On the other hand, a portion of the reaction force which is generated due to the predetermined pressing force exerted by the pressing force generating device 32 can be distributed to the locking mechanism 5, such that stress concentration is reduced effectively to improve stability and service life of the testing apparatus.

Reference is made to FIGS. 3A and 3B in which FIG. 3A is a schematic view of a second embodiment according to the invention showing that a press head 3 is separated from a socket plate 4, and FIG. 3B is a schematic view of the second embodiment according to the invention showing that the press head 3 is engaged with the socket plate 4. The second embodiment differs from the first embodiment in that the pawl 51 in the second embodiment is translated to detain or release the socket plate 4, while the pawl 51 in the first embodiment is swung.

Specifically, the two pawls 51 in the second embodiment are coupled to two opposite ends of the slider 501 and movable horizontally with respect to the slider in such a manner that a slide pin 542 on the pawl 51 is extended into a slide slot 543 formed on the slider 501 and restricted in the slide slot 543. In this embodiment, each pawl 51 includes a head end 54 and a tail end 55. The head end 54 is formed with an inclined section 541 while the tail end 55 is formed with a pawl portion 515. On the other hand, the base 50 is provided with two recesses 506 corresponding to the inclined section, which is capable of receiving the head end 54 of the pawl 51.

The operation of the second embodiment will be described later. When an electronic device C placed in the chip socket 41 is to be tested, the lifting arm 2 is lowered so that the contact portion 31 is in contact with the electronic device C. Then, the lifting arm 2 is further lowered so that the inclined sections 541 formed on the head ends 54 of the pawls 51 are inserted into the recesses 506 and abutted against the base 50 in the recesses 506 while the two pawls 51 are moved toward each other, so that the pawl portions 515 on the tail ends 55 detain the two ends of the socket plate 4, and the press head 3 and the socket plate 4 are engaged with each other as shown in FIG. 3B. After that, the pressing force generating device 32 exerts a pressing force F to the contact portion 31, the electronic device C, the chip socket 41 and the socket plate 4. At last, the electronic device C is tested.

Similarly, a two-step pressing manner is used in the second embodiment, wherein in the first step, the lifting arm 2 is lowered until the contact portion 31 is in contact with the electronic device C, and in the second step, the base 50 and the slider 501 are moved toward each other so that the pawls 51 are horizontally and inwardly moved with respect to the slider 501, and the pawl portions 515 on the tail ends 55 of the two pawls 51 detain the socket plate 4. As a result, the press head 3 is firmly engaged with the socket plate 4.

Reference is made to FIGS. 4A and 4B, in which FIG. 4A is a schematic view of a third embodiment according to the invention showing that a press head 3 is separated from a socket plate 4, and FIG. 4B is a schematic view the third embodiment according to the invention showing that the press head 3 is engaged with the socket plate 4. The pawls 51 are configured to be swung to detain or release the socket plate 4 in the first and third embodiments, but the mechanisms and principles of operation for the third embodiment are different from those for the first embodiments.

Specifically, the base 50 of the third embodiment is provided with a pawl holder 500 which protrudes downwardly and on which the pawl 51 is hinged. The contact portion 31 is provided with a push rod 311, and a roller 312 arranged on the end of the push rod 311. The roller 312 is abutted against a lateral surface of the pawl 51.

The operation of the third embodiment will be described later. When an electronic device C placed in the chip socket 41 is to be tested, the lifting arm 2 is lowered so that the contact portion 31 is in contact with the electronic device C. Then, the lifting arm 2 is further lowered so that the roller 312 of the push rod 311 urges an upper end of the pawl 51 and causes the upper end of the pawl 51 to be swung outwardly. Similar to a see-saw, the lower end of the pawl 51 is swung inwardly, i.e. toward the socket plate 4 and detains the socket plate 4. As such, the press head 3 and the socket plate 4 are engaged with each other, as shown in FIG. 4B. After that, the pressing force generating device 32 exerts a pressing force F to the contact portion 31, the electronic device C, the chip socket 41 and the socket plate 4. At last, the electronic device C is tested.

Similar to the first and second embodiments, in the third embodiment, a two-step pressing manner is also used, wherein in the first step, the lift arm 2 is lowered until the contact portion 31 is in contact with the electronic device C, and in the second step, the base 50 and the slider 501 are moved toward to each other so that the roller 312 of the push rod 311 urges the upper end of the pawl 51 and causes the lower end of the pawl 51 to be swung inward to detain the socket plate 4. As such, the press head 3 is firmly engaged with the socket plate 4.

Reference is made to FIGS. 5A and 5B, in which FIG. 5A is a schematic view of a fourth embodiment according to the invention showing that a press head 3 is separated from a socket plate 4, and FIG. 5B is a schematic view of the fourth embodiment according to the invention showing that the press head 3 is engaged with the socket plate 4. Similar to the first, second and third embodiments, the pawls 51 are configured to detain the socket plate 4 in the fourth embodiment, but the mechanisms and principles of operation for the fourth embodiment are different from those for the first, second and third embodiments.

Specifically, in the fourth embodiment, the locking mechanism 5 includes two pawls 51 which are arranged in a crosswise manner and hinged to the slider 501. Each pawl 51 includes a first end 512 having a slot 514 and a second end 513 having a pawl portion 515. The base 50 is provided with two set pins 33 protruded into the slots 514 and movable along the slots, respectively. The relative movement of the base 50 toward or away from the slider 501 causes the pawl portions 515 on the second ends 513 of the two pawls 51 to be swung outwardly or inwardly to detain or release the socket plate 4 due to the fact the set pins 33 are confined in and movable along the slots 514. The two pawls 51 are operated in a way similar to scissors.

The operation of the fourth embodiment will be described later. When an electronic device C placed in the chip socket 41 is to be tested, the lifting arm 2 is lowered so that the contact portion 31 is in contact with the electronic device C. After that, the lifting arm 2 is further lowered so that the base 50 is moved toward the slider 501 and the set pins 33 of the base 50 confined in the slots 514 are moved downwardly. As a result, the first ends 512 of the two pawls 51 are swung outwardly while the second ends 513 of the two pawls 51 are also swung outwardly to detain the socket plate 4. As such, the press head 3 and socket plate 4 are engaged with each other, as shown in FIG. 5B. The socket plate 4 of the fourth embodiment is configured differently from those of the first, second and third embodiments and is provided with an opening 43 for insertion of the second ends 513 of the two pawls 51. The pressing force generating device 32 exerts a pressing force F to the contact portion 31, the electronic device C, the chip socket 41 and the socket plate 4. At last, the electronic device C is tested.

Similar to the first, second and third embodiment, a two-step pressing manner is also used in the fourth embodiment, wherein in the first step, the lift arm 2 is lowered until the contact portion 31 is in contact with the electronic device C, and in the second step, the base 50 is moved toward the slider 501 so that the set pins 33 of the base 50 are moved downwardly along the slots 514 and cause the first ends 512 of the two pawls 51 to be swung outwardly and the pawl portions 515 of the second ends 513 of the pawls 51 to be swung outwardly to detain the socket plate 4. As such, the press head 3 and the socket plate 4 are firmly engaged with each other.

Reference is made to FIGS. 6A and 6B, wherein FIG. 6A is a schematic view a fifth embodiment according to the invention showing that a press head 3 is separated from a socket plate 4, and FIG. 6B is a schematic view of the fifth embodiment according to the invention showing that the press head 3 is engaged with the socket plate 4. The fifth embodiment is similar to the fourth embodiment but slightly different in the mechanism and principle of operation.

Specifically, in fifth embodiment, the locking mechanism 5 includes two pawls 51 which are arranged in a crosswise manner and hinged to the slider 501. Each pawl 51 includes an upper section 522 and a lower section 523 including a pawl portion 515. The base 50 is provided with a push block 34. When the push block 34 is positioned between the upper sections 522 of the two pawls 51 and moved upwardly or downwardly, the pawls 515 of the lower sections 523 of the two pawls 51 are swung outwardly or inwardly to detain or release the socket plate 4. The two pawls 51 are operated in a way similar to scissors.

The operation of the fifth embodiment will be described later. When an electronic device C placed in the chip socket 41 is to be tested, the lifting arm 2 is lowered so that the contact portion 31 is in contact with the electronic device C. Then, the lifting arm 2 is further lowered so that the push block 34 of the base 50 is moved downwardly and causes the upper sections 522 of the two pawls 51 to be swung outwardly and the lower sections 523 of the two pawls 51 to be swung outwardly to detain the socket plate 4. As such, the press head 3 and socket plate 4 are engaged with each other, as shown in FIG. 6B. Similar to the fourth embodiment, in the fifth embodiment, the socket plate 4 is provided with an opening 43 for insertion of the lower sections 523 of the two pawls 51. The pressing force generating device 32 exerts a pressing force F to the contact portion 31, the electronic device C, the chip socket 41 and the socket plate 4. At last, the electronic device C is tested.

Similar to the first to fourth embodiments, a two-step pressing manner is also used in the fifth embodiment, wherein in the first step, the lift arm 2 is lowered until the contact portion 31 is in contact with the electronic device C, and in the second step, the base 50 is moved toward the slider 501 so that the push block 34 of the base 50 is moved downwardly and causes the upper sections of the two pawls 51 to be swung outwardly and pawl portions 515 of the lower section 523 of the two pawls 51 to be swung outwardly to detain the socket plate 4. As such, the press head 3 and the socket plate 4 are firmly engaged with each other.

Reference is made to FIGS. 7A to 7C, wherein FIG. 7A is a schematic view of a sixth embodiment according to the invention showing that a press head 3 is separated from a socket plate 4, FIG. 7B is a schematic view of the sixth embodiment according to the invention showing that the press head 3 is engaged with the socket plate 4, and FIG. 7C is a schematic view of the sixth embodiment according to the invention showing that the press head 3 is being separated from the socket plate 4.

As shown in the figures, the locking mechanism 5 includes essentially a plug 52, a positioning pin 53 and a plate slider 42, wherein the plug 52 is disposed on the slider 501 and movable upwardly or downwardly together with the slider 501. The positioning pin 53 is connected to the base 50 while the plate slider 42 is arranged beneath the socket plate 4 and is horizontally movable with respect to the lower surface of the socket plate 4 so as to detain the plug 52 on the socket plate 4 or release the plug 52 from the socket plate 4.

The operation of the sixth embodiment will be described later. When an electronic device C placed in the chip socket 41 is to be tested, the lifting arm 2 is lowered so that the contact portion 31 is in contact with the electronic device C (not shown in FIGS. 7A to 7C). The plug 52 is inserted into the opening 43 of the socket plate 4. Then, the lifting arm 2 is further lowered so that the positioning pin 53 is inserted into an opening 44 of the socket plate 4 and pushes the plate slider 42 inwardly to detain the plug 52. As such, the press head 3 and the socket plate 4 are engaged with each other, as shown in FIG. 7B.

FIG. 7C shows that the press head 3 is being separated from the socket plate 4. The lifting arm 2 is lifted so that the positioning pin 53 is extracted from the opening 44 of the socket plate 4, and the plate slider 42 is moved out of the range of the opening 43 to release the plug 52. After that, the plug 52 is lifted together with the lifting arm 2 and extracted from the opening 43. It is noted that, in the sixth embodiment, a component (not shown) such as a spring is arranged between the plate slider 42 and the socket plate 4 for normally biasing the plate slider 42 to an initial position which is out of the range of the opening 43.

Similar to the first to fifth embodiments, a two-step pressing manner is also used in the sixth embodiment, wherein in the first step, the lift arm 2 is lowered until the plug 52 is inserted into the opening 43 of the socket plate 4 and the contact portion 31 is in contact with the electronic device C, and in the second step, the base 50 is moved toward the slider 501 so that the positioning pin 53 on the base 50 is moved downwardly and inserted into the opening 44 of the socket plate 4 and biases the plate slider 42 inwardly to detain the plug 52. As such, the press head 3 and the socket plate 4 are firmly engaged with each other.

Reference is made to FIGS. 8A and 8B, wherein FIG. 8A is a schematic view of a seventh embodiment according to the invention showing that a press head 3 is separated from a socket plate 4, and FIG. 8B is a schematic view of the seventh embodiment according to the invention showing that the press head 3 is engaged with the socket plate 4.

As shown in the figures, in the seventh embodiment, the locking mechanism 5 includes essentially two ratchets 56 and two ratchet locking rods 57, wherein the ratchets 56 are respectively hinged to two ratchet holders 561 arranged on the slider 501. Each ratchet locking rod 57 is arranged on the base 50 and provided at its end with a ratchet toggle portion 571 and a ratchet locking portion 572. When the lifting arm 2 is lowered so that the contact portion 31 is in contact with the electronic device C, the ratchet toggle portions 571 toggle the ratchets 56 so that the ratchets 56 are engaged with the socket plate 4, and the ratchet locking portions 572 detain the ratchets 56 and prevent the ratchets 56 from being loosened or rotated.

Reference is made to FIGS. 9A to 9D showing the operation of the ratchet locking rod 57, the ratchet 56 and the socket plate 4 in the seventh embodiment according to the invention. The operation of the seventh embodiment will be described later. When an electronic device C placed in the chip socket 41 is to be tested, the lifting arm 2 is lowered so that the contact portion 31 is in contact with the electronic device C. At the same time, the ratchet 56 is moved downwardly so that at least a portion of the ratchet 56 is positioned lower than the socket plate 4. Subsequently, the lifting arm 2 is further lowered and causes the ratchet locking rod 57 to be moved downwardly so that the ratchet toggle portion 571 toggles the ratchet 56, as shown in FIG. 9B and one of the teeth of the ratchet 56 is engaged with the lower surface of the socket plate 4, as shown in FIG. 9C. At last the ratchet locking rod 57 is moved downwardly so that the ratchet locking portion 572 detains the ratchet 56 and prevents the ratchet 56 from being loosened or rotated, as shown in FIG. 9D. As such, the press head 3 and the socket plate 4 are engaged with each other, as shown in FIG. 8B.

Similar to the first to sixth embodiments, a two-step pressing manner is also used in the seventh embodiment, wherein in the first step, the lift arms 2 is lowered until the contact portion 31 is in contact with the electronic device C while the ratchet 56 on the end of the ratchet holder 561 is moved downwardly so that at least portion of the ratchet 56 is positioned lower than the socket plate 4, and in the second step, the base 50 is moved toward the slider 501 together with the ratchet locking rod 57 on the base 50 so that the ratchet 56 is toggled by the ratchet toggle portion 571 and then detained by the ratchet locking portion 572. As such, the press head 3 is firmly engaged with the socket plate 4.

Figure 10C:
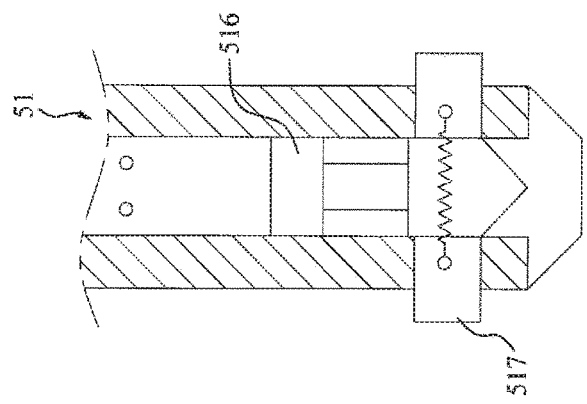
Figure 10B:
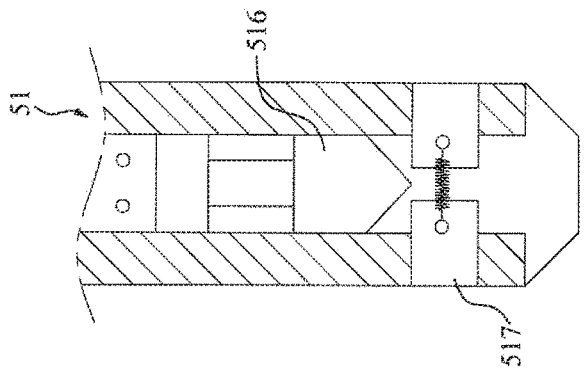
FIG. 10B is a schematic view of the eighth embodiment according to the invention showing that a horizontal slider is housed in a pawl.
Figure 10A:
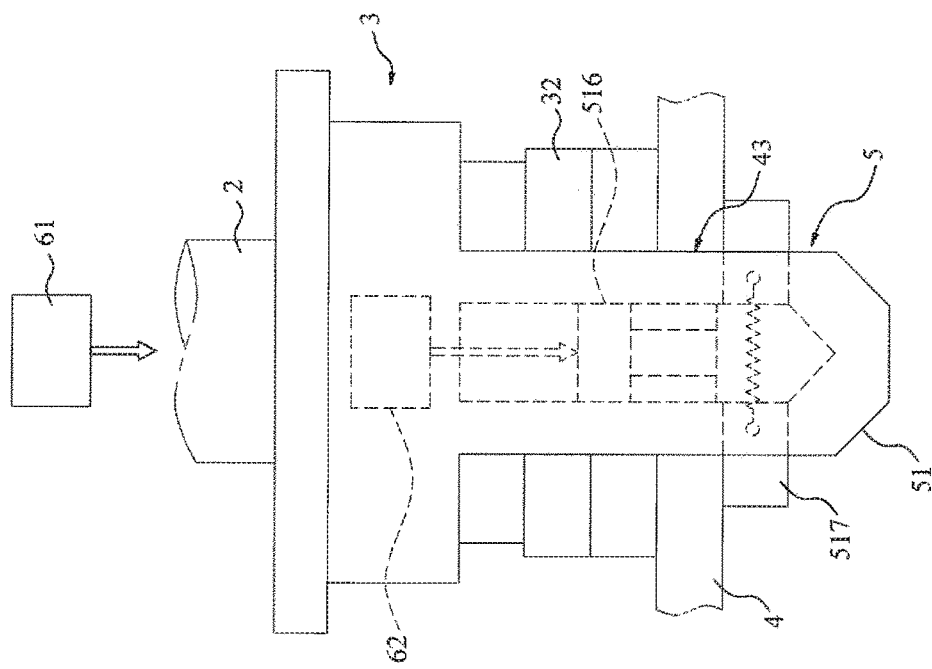
FIG. 10A is a schematic view of an eighth embodiment according to the invention showing that the press head is engaged with the socket plate.

Reference is made to FIGS. 10A to 10C, wherein FIG. 10A is a schematic view of an eighth embodiment according to the invention showing that the press head 3 is engaged with the socket plate 4, FIG. 10B is a schematic view of the eighth embodiment according to the invention showing that a horizontal slider 517 is housed in a pawl 51, and FIG. 10C is a schematic view of the eighth embodiment according to the invention showing that the horizontal slider 517 is protruded out of the pawl 51.

In eighth embodiment, the locking mechanism 5 includes two pawls 51 disposed on the press head 3 and spaced from each other by a distance. It is noted that the two pawls 51 are aligned in the direction perpendicular to the drawing sheet so that FIG. 10A shows only one of the pawls 51. Each pawl 51 includes a lifting slide bar 516 connected to a second power source 62, and two horizontal sliders 517. The second power source 62 of the eighth embodiment is a compressed air supply. The lifting slide bar 516 can be lowered or lifted pneumatically, and the horizontal slider 517 can be urged outwardly by the lifting slide bar 516 so as to detain the socket plate 4 or retracted by a spring so as to release the socket plate 4.

The operation of the eighth embodiment will be described later. When an electronic device C placed in the chip socket 41 is to be tested, the lifting arm 2 is lowered by the first power source 61 so that the contact portion 31 is in contact with the electronic device C. The pawl 51 of the eighth embodiment is inserted into the opening 43 of the socket plate 4. Subsequently, the lifting slide bar 516 disposed within the pawl 51 is lowered by the second power source 62 so as to protrude the horizontal slider 517 to detain the lower surface of the socket plate 4. As such, the press head 3 and the socket plate 4 are engaged with each other, as shown in FIG. 10A. Further, the pressing force generating device 32 exerts a pressing force F to the contact portion 31, the electronic device C, the chip socket 41 and the socket plate 4. At last, the electronic device C is tested.

Separation of the press head 3 from the socket plate 4 is described herein. The lifting slide bar 516 disposed within the pawl 51 is lifted by the second power source 62 such that the horizontal slider 517 is biased inwardly by a spring and retracted into the pawl 51. Subsequently, the lifting arm 2 is lifted by the first power source 61 such that the pawl 51 is withdrawn from the opening 43 of the socket plate 4, and the press head 3 is unengaged from the socket plate 4.

It is noted that the two-step manner implemented by a linkage mechanism is used in the first to seventh embodiments, and the two-step manner implemented by two individual power sources is used in the eighth embodiment. The invention is described with reference to the embodiments which are actuated by different manner. The scope of the invention should cover both of the manner implemented by a linkage mechanism and the manner implemented by multiple power sources. In other words, the two-step manner used in the first to seventh embodiments may be implemented by two individual power sources, while the two-step manner used in the eighth embodiment may be implemented by the linkage mechanism.

The above embodiments are described only for illustrative purposes. The scope of the invention is defined the appended claims and of limited to the embodiments.

What is claimed is:

1. An electronic device testing apparatus, comprising:
a lifting arm;
a press head disposed on the lifting arm, the press head including a pressing force generating device and a contact portion arranged on the pressing force generating device;
a socket plate disposed beneath the press head and provided with a chip socket; and
a locking mechanism arranged on at least one of the press head and the socket plate;
wherein when an electronic device placed in the chip socket is to be tested, the lifting arm is lowered so that the contact portion is in contact with the electronic device, the locking mechanism is actuated to detain the press head on the socket plate, the pressing force generating device exerts a pressing force onto the contact portion, the electronic device, the chip socket and the socket plate, and at least a portion of a reaction force is exerted on the locking mechanism;
wherein the locking mechanism comprises a base attached to the lifting arm and a slider carrying the pressing force generating device, wherein the slider is coupled to the base in such a manner that the slider is capable of being moved toward or away from the base.

2. The electronic device testing apparatus as claimed in claim 1, wherein the locking mechanism further comprises at least one pawl disposed on the press head; when the lifting arm is lowered so that the contact portion is in contact with the electronic device, the at least one pawl detains the socket plate.

3. The electronic device testing apparatus as claimed in claim 2, wherein the at least one pawl includes a fixed portion and a movable portion, the fixed portion has one end hinged to the base and the other end hinged to the slider, and the movable portion is configured to selectively detain or release the socket plate.

4. The electronic device testing apparatus as claimed in claim 3, wherein the locking mechanism further includes at least one spring arranged between the base and the slider; the base includes at least one protrusion and at least one guide bar extending toward the socket plate; the slider includes at least one guide hole into which the at least one guide bar extends; said one end of the fixed portion of the at least one pawl is hinged to the at least one protrusion of the base, and said other end of the fixed portion of the at least one pawl is hinged to the slider.

5. The electronic device testing apparatus as claimed in claim 2, wherein the at least one pawl is coupled to the slider and is movable horizontally with respect to the slider, the at least one pawl includes a head end having an inclined section and a tail end having a pawl portion; the base is provided with at least one recess corresponding to the inclined section; downward movement of the base causes the at least one pawl to move horizontally with respect to the slider so that the pawl portion of the tail end of the pawl detains the socket plate.

6. The electronic device testing apparatus as claimed in claim 2, wherein the at least one pawl is hinged to the base; the slider, the pressing force generating device or the contact portion is provided with at least one push rod; when the lifting arm is lowered so that the contact portion is contact with the electronic device, the at least one push rod biases one end of the at least one pawl so that the other end of the at least one pawl is swung to the socket plate and detains the socket plate.

7. The electronic device testing apparatus as claimed in claim 2, wherein the locking mechanism includes two pawls arranged in a crosswise manner and hinged to the slider; each of the pawls includes a first end having a slot and a second end having a pawl portion; the base includes two set pins protruded into the slots and movable along the slots, respectively; and movement of the base toward or away from the slider causes the second ends of the pawls to be swung inwardly or outwardly so that the pawl portions detain or release the socket plate.

8. The electronic device testing apparatus as claimed in claim 2, wherein the locking mechanism includes two pawls arranged in a crosswise manner and hinged to the slider; the base includes a push block, each of the pawls includes an upper section and a lower section having a pawl portion, the push block is positioned between the upper sections of the two pawls so that the upper sections of the two pawls are abutted on the push block; and movement of the base toward or away from the slider causes the lower sections of the two pawls to be swung inwardly or outwardly so that the pawl portions detain or release the socket plate.

9. The electronic device testing apparatus as claimed in claim 1, wherein the locking mechanism further includes a plug arranged on the slider, a positioning pin arranged on the base and a plate slider capable of sliding along the socket plate; when the lifting arm is lowered so that the contact portion is in contact with the electronic device, the plug and the positioning pin are moved downwardly so that the plug is inserted into the socket plate while the positioning pin biases the plate slider inwardly to detain the plug.

10. The electronic device testing apparatus as claimed in claim 1, wherein the locking mechanism further includes at least one ratchet hinged to the slider and at least one ratchet locking rod arranged on the base; the at least one ratchet locking rod includes a ratchet toggle portion and a ratchet locking portion; when the lifting arm is lowered so that the contact portion is in contact with the electronic device, the ratchet toggle portion toggles the at least one ratchet so that the at least one ratchet detains the socket plate, and the ratchet locking portion detains the at least one ratchet and prevents the at least one ratchet from being loosened or rotated.

11. An electronic device testing apparatus, comprising:
a lifting arm;
a press head disposed on the lifting arm, the press head including a pressing force generating device and a contact portion arranged on the pressing force generating device;
a socket plate disposed beneath the press head and provided with a chip socket; and
a locking mechanism arranged on at least one of the press head and the socket plate;
wherein when an electronic device placed in the chip socket is to be tested, the lifting arm is lowered so that the contact portion is in contact with the electronic device, the locking mechanism is actuated to detain the press head on the socket plate, the pressing force generating device exerts a pressing force onto the contact portion, the electronic device, the chip socket and the socket plate, and at least a portion of a reaction force is exerted on the locking mechanism;
wherein the locking mechanism includes at least one pawl disposed on the press head; the pawl includes a lifting slide bar and at least one horizontal slider; when the lifting arm is lowered so that the contact portion is in contact with the electronic device, the lifting slide bar is lowered and pushes the at least one horizontal slider to protrude beyond the pawl so as to detain the socket plate.

12. An electronic device testing apparatus, comprising:
a first power source;
a lifting arm connected to the first power source;
a press head disposed on the lifting arm;
a socket plate disposed beneath the press head and provided with a chip socket;
a second power source; and
a locking mechanism arranged on at least one of the press head and the socket plate and connected to the second power source;
wherein when an electronic device placed in the chip socket is to be tested, the lifting arm is actuated by the first power source so that the press head is abutted on the electronic device, the locking mechanism is actuated by the second power source to detain the press head on the socket plate or release the press head from the socket plate.

13. The electronic device testing apparatus as claim 12, further comprising a pressing force generating device disposed on the press head; when the locking mechanism is actuated to detain the press head on the socket plate, the pressing force generating device exerts a pressing force onto the contact portion, the electronic device, the chip socket and the socket plate, and at least a portion of a reaction force is exerted on the locking mechanism.

14. The electronic device testing apparatus as claimed in claim 12, wherein the locking mechanism includes at least one pawl disposed on the press head; the pawl includes a lifting slide bar connected to the second power source and at least one horizontal slider; when the lifting arm is actuated by the first power source so that the press head is abutted on the electronic device, the lifting slide bar is actuated by the second power source and pushes the at least one horizontal slider to protrude beyond the pawl so as to detain the press head on the socket plate.

* * * * *